(12) United States Patent
Takahashi et al.

(10) Patent No.: US 7,655,992 B2
(45) Date of Patent: Feb. 2, 2010

(54) SEMICONDUCTOR DEVICE

(75) Inventors: Shuichi Takahashi, Gunma (JP); Yutaka Yamada, Gunma (JP); Masaru Kanai, Gunma (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 285 days.

(21) Appl. No.: 11/806,462

(22) Filed: May 31, 2007

(65) Prior Publication Data
US 2007/0278594 A1    Dec. 6, 2007

(30) Foreign Application Priority Data
Jun. 1, 2006    (JP)    ............................... 2006-153203

(51) Int. Cl.
*H01L 31/119*    (2006.01)
*H01L 21/332*    (2006.01)
(52) U.S. Cl. ...................................... 257/409; 438/140
(58) Field of Classification Search ................. 257/350, 257/379, 355–360, 401, 409, E29.012; 438/140, 438/454
See application file for complete search history.

(56) References Cited
U.S. PATENT DOCUMENTS
6,388,252 B1 *    5/2002    Takahashi et al. .............. 850/7

FOREIGN PATENT DOCUMENTS

| JP | 05-175228 | 7/1993 |
|---|---|---|
| JP | 9-26758 | 1/1997 |
| JP | 2003-224267 | 8/2003 |

* cited by examiner

*Primary Examiner*—Calvin Lee
(74) *Attorney, Agent, or Firm*—Morrison & Foerster LLP

(57) ABSTRACT

The invention is directed to providing a resistor with high reliability. The invention is also directed to miniaturizing a semiconductor device having a MOS transistor and a resistor element on the same semiconductor substrate. An N-type well region is formed in a front surface of a P-type semiconductor substrate, and a P⁻-type resistor layer is formed in a front surface of the well region. A conductive layer is annularly formed on the well region so as to surround the resistor layer. A predetermined voltage is applied to the conductive layer and a channel is not formed under the conductive layer during normal operation, thereby isolating a pull-down resistor from the other elements (e.g. a P-channel type MOS transistor). The resistor layer and an element isolation insulation film do not contact each other. Both the PMOS and the pull-down resistor are formed in one region surrounded by the element isolation insulation film.

4 Claims, 4 Drawing Sheets

SEMICONDUCTOR DEVICE

CROSS-REFERENCE OF THE INVENTION

This application claims priority from Japanese Patent Application No. 2006-153203, the content of which is incorporated herein by reference in its entirety.

BACKGROUND OF THE INVENTION

1. Field of the Invention

The invention relates to a semiconductor device, particularly to a semiconductor device having a MOS transistor and a resistor on the same semiconductor substrate.

2. Description of the Related Art

A semiconductor device in which a MOS transistor and a resistor are mounted on the same semiconductor substrate has been conventionally known. A drive circuit of a vacuum fluorescent display is known as using this semiconductor device. The vacuum fluorescent display is also called VFD (Vacuum Fluorescent Display), and emits light when electrons flowing from a cathode electrode are controlled by a grid electrode and impact a phosphor on an anode electrode in a vacuum chamber. The vacuum fluorescent display is used as a digital display part of an audio system, a watch, an electronic calculator or the like.

This vacuum fluorescent display need a high voltage in the anode electrode and the grid electrode in order to emit light, and the output stage of the drive circuit is generally configured as follows. This output stage of the drive circuit includes a P-channel type MOS transistor (hereafter, referred to as PMOS) 100 connected between an output terminal Out and a power supply voltage VDD and a pull-down resistor 102 connected between the drain side of the PMOS 100 and a negative voltage supply terminal 101, as shown in FIG. 2. A back gate of the PMOS 100 is connected with the power supply voltage VDD. The output terminal Out is connected with a grid electrode and an anode electrode (not shown).

An output signal (a driver signal DRV) of a logic circuit (not shown) is applied to a gate of the PMOS 100, and thereby on and off of the PMOS 100 are controlled. A predetermined voltage (a high level and a low level) is supplied to the grid electrode and the anode electrode by controlling the PMOS 100. The power supply voltage VDD is about 5V, for example, and the negative voltage supply terminal 101 supplies a negative voltage of about −30V to −40V.

Next, the device structure of the PMOS 100 will be described referring to FIGS. 3A and 3B. FIG. 3A is a plan view of the PMOS 100, and FIG. 3B is a cross-sectional view of FIG. 3A along line Y-Y. This PMOS 100 is so configured that a plurality of MOS transistor structures forms one high voltage PMOS 100 as a whole.

As shown in FIGS. 3A and 3B, in a PMOS 100 formation region, an N-type well region 106 is formed in a front surface of a P-type semiconductor substrate 105, and an element isolation insulation film 107 is formed on this well region 106 by a LOCOS method or the like. A plurality of gate electrodes 108 is annularly formed on the front surface of the semiconductor substrate 105 (the well region 106) where the element isolation insulation film 107 is not formed, with a gate insulation film (not shown) interposed therebetween. $P^-$-type low concentration drain regions 109 are formed in the front surface of the semiconductor substrate 105 (the well region 106) in regions surrounded by the gate electrodes 108 respectively, and $P^+$-type high concentration drain regions 110 for contacts are formed in the front surface of the low concentration drain regions 109 respectively. $P^+$-type high concentration source regions 111 corresponding to the low concentration drain regions 109 are formed in the front surface of the semiconductor substrate 105 (the well region 106) on the outside of the annular gate electrodes 108, surrounding each of the gate electrodes 108.

It is noted that conductivity types $P^+$, P, $P^-$ and the like belong to one general conductivity type, and conductivity types $N^+$, N, $N^-$ and the like belong to another general conductivity type.

An interlayer insulation film 112 is formed on the front surface of the semiconductor substrate 105 including on the gate electrodes 108, and contact portions 113 are formed in this interlayer insulation film 112, reaching the high concentration drain regions 110 and the high concentration source regions 111. Furthermore, wiring layers 114 and 115 are formed in these contact portions 113. The wiring layer 114 is commonly connected with the high concentration source regions 111, and the wiring layer 115 is commonly connected with the high concentration drain regions 110. The wiring layer 114 is connected with the power supply voltage VDD, and the wiring layer 115 is connected with an output terminal Out and one end of the pull-down resistor 102 that will be described below. A driver signal DRV is applied to each of the gate electrodes 108.

Next, the device structure of the pull-down resistor 102 will be described referring to FIGS. 4A and 4B. FIG. 4A is a plan view of the pull-down resistor 102, and FIG. 4B is a cross-sectional view of FIG. 4A along line Z-Z.

As shown in FIGS. 4A and 4B, an N-type well region 120 is formed in the front surface of the semiconductor substrate 105 in a pull-down resistor 102 formation region, and an element isolation insulation film 121 for isolating the pull-down resistor 102 from the other elements (the above-described PMOS 100 or the like) is formed on this well region 120 by a LOCOS method or the like. A $P^-$-type resistor layer 122 is formed in the front surface of the well region 120 surrounded by the element isolation insulation film 121 by implanting a low concentration of P-type impurity therein, and $P^+$-type electrode leading layers 123 are further formed therein like islands by implanting a high concentration of P-type impurity therein.

A P-type impurity ion is implanted between the electrode leading layers 123 opposing each other to form an impurity layer 124 (FP) in order to prevent voltage dependence. Contact portions 125 and 126 are formed on the electrode leading layers 123, and wiring layers 127 and 128 are formed in the contact portions 125 and 126. The electrode leading layer 123 is connected with the drain side of the above-described PMOS 100 and the output terminal Out through the wiring layer 127, and the other electrode leading layer 123 is connected with the negative voltage supply terminal 101 through the wiring layer 128. This technology is described in Japanese Patent Application Publication Nos. H9-26758 and 2003-224267, for example.

However, in the above-described resistor (the pull-down resistor 102), the element isolation insulation film 121 is formed adjacent to the resistor layer 122. Therefore, stress is concentrated on the end of the element isolation insulation film 121, and the degradation of a breakdown voltage may occur between the resistor layer 122 and the well region 120.

Furthermore, since a semiconductor integrated circuit with higher density and higher performance has been developed recently, the area of each of semiconductor elements need be minimized. Therefore, it is preferable to miniaturize the described semiconductor device in which the MOS transistor and the resistor are mounted together.

The invention is directed to providing a resistor with high reliability. The invention is also directed to miniaturizing a semiconductor device in which a MOS transistor and a resistor are mounted together on the same semiconductor substrate.

SUMMARY OF THE INVENTION

The invention is directed to solving the above problems and the feature of the invention is as follows. The invention provides a semiconductor device including: a second conductive type well layer formed in a front surface of a first conductive type semiconductor substrate; an element isolation insulation film formed on the front surface of the semiconductor substrate; a MOS transistor formed in the well layer; and a resistor formed in the well layer, wherein the MOS transistor and the resistor are formed in a region surrounded by the element isolation insulation film, and the resistor includes a first conductive type resistor layer formed in a front surface of the well layer and a conductive layer annularly formed on the well layer so as to surround the resistor layer.

DETAILED DESCRIPTION OF THE INVENTION

Figure 1A:
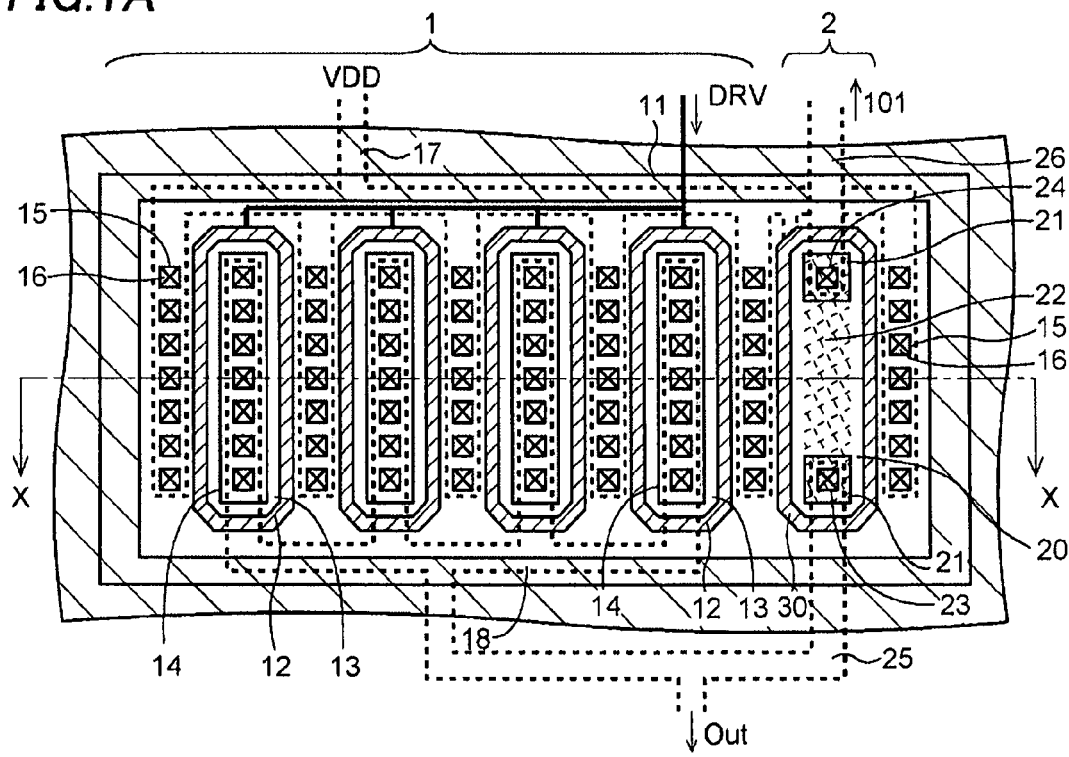
FIGS. 1A and 1B are a plan view and a cross-sectional view for explaining a semiconductor device of an embodiment of the invention.
Figure 1B:
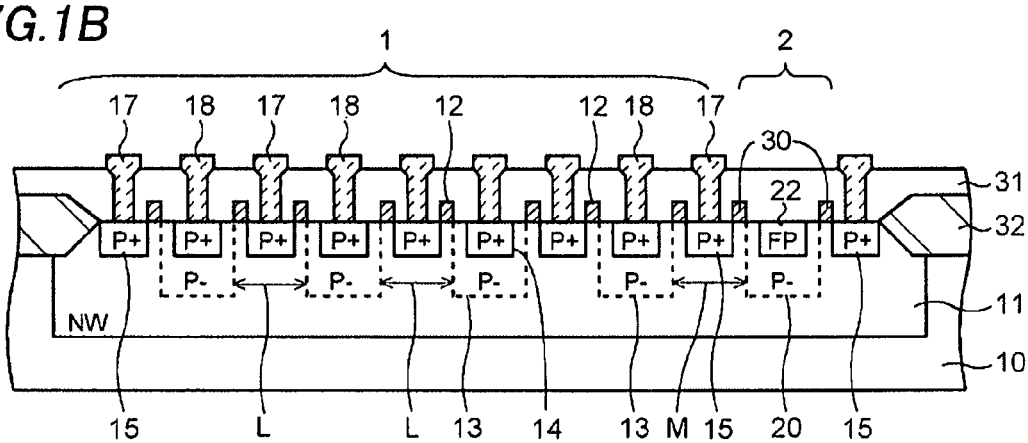
Figure 2:
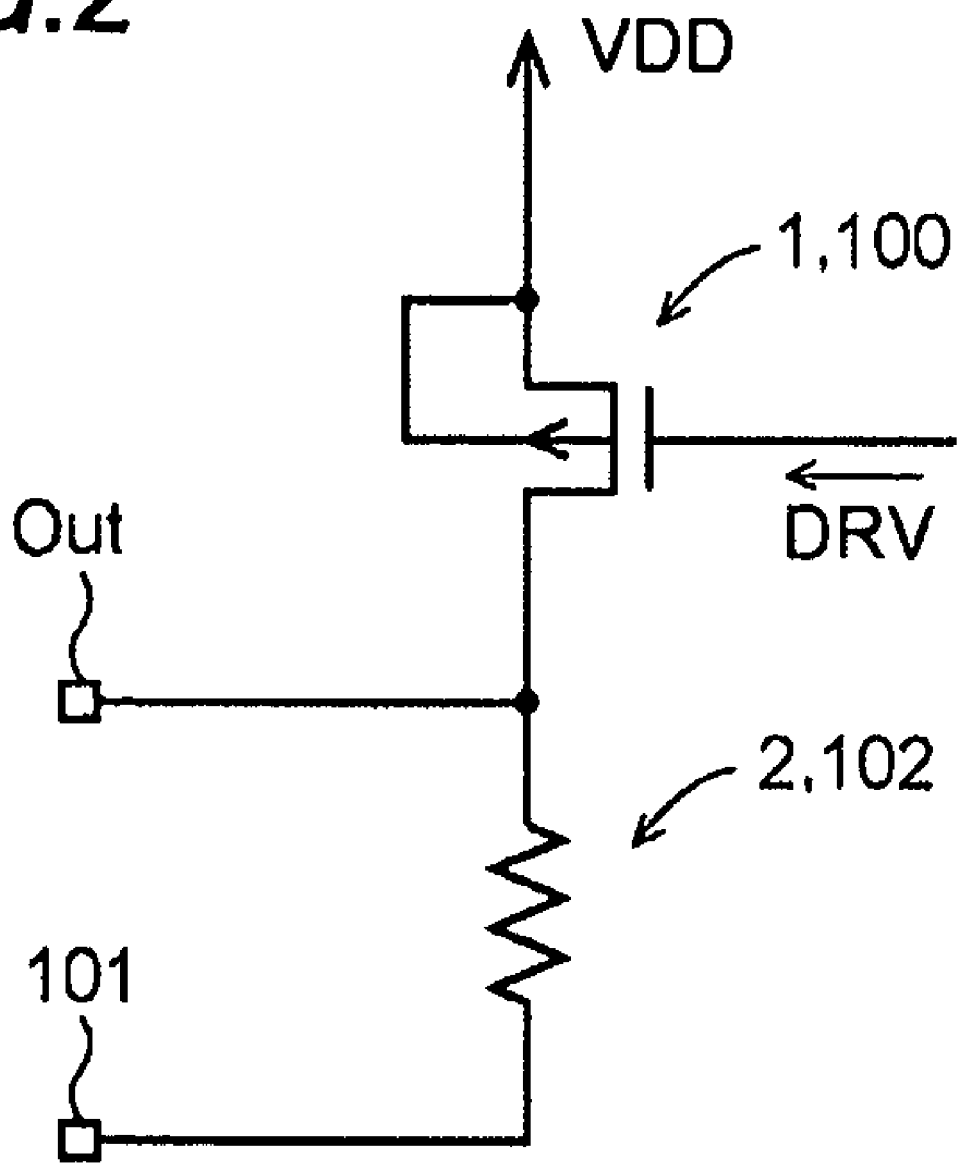
FIG. 2 is a circuit diagram for explaining the semiconductor device of the embodiment of the invention and a conventional semiconductor device.
Figure 3A:
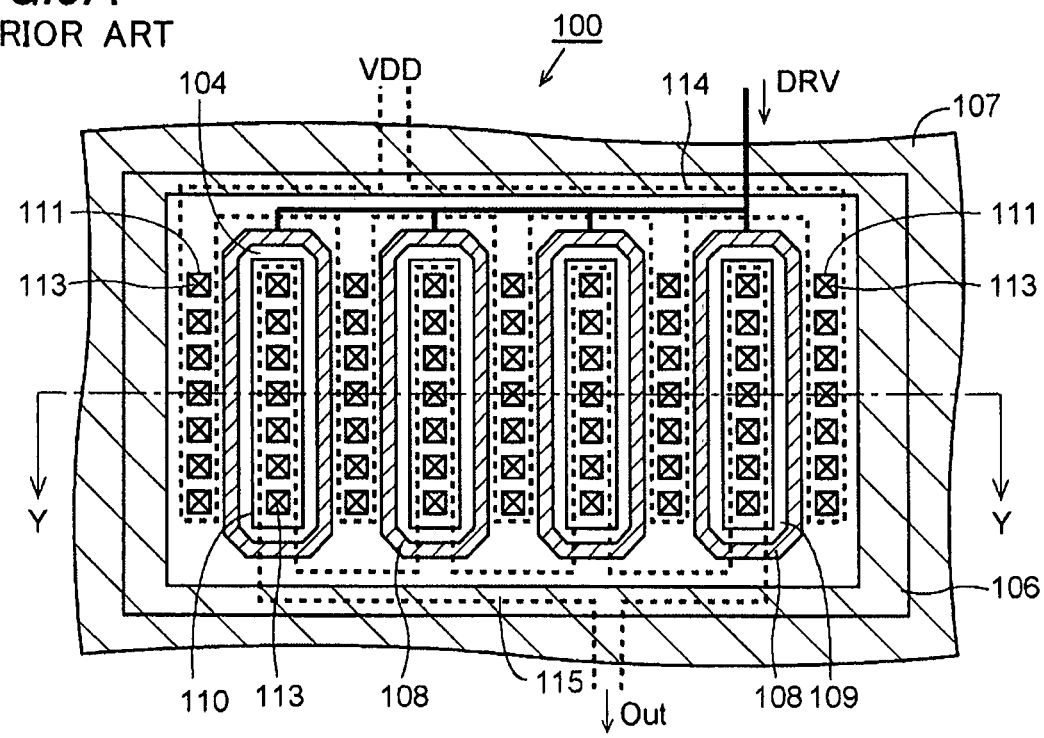
FIGS. 3A and 3B are a plan view and a cross-sectional view for explaining the conventional semiconductor device.
Figure 3B:
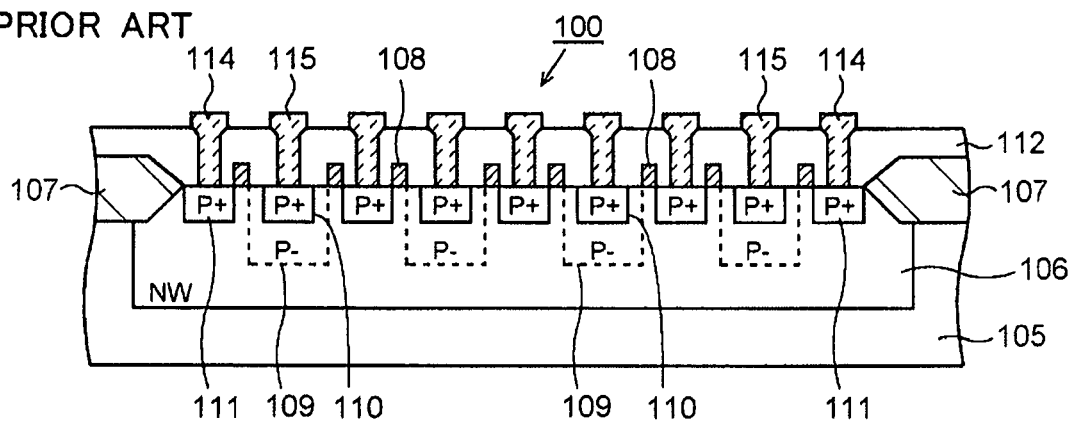
Figure 4A:
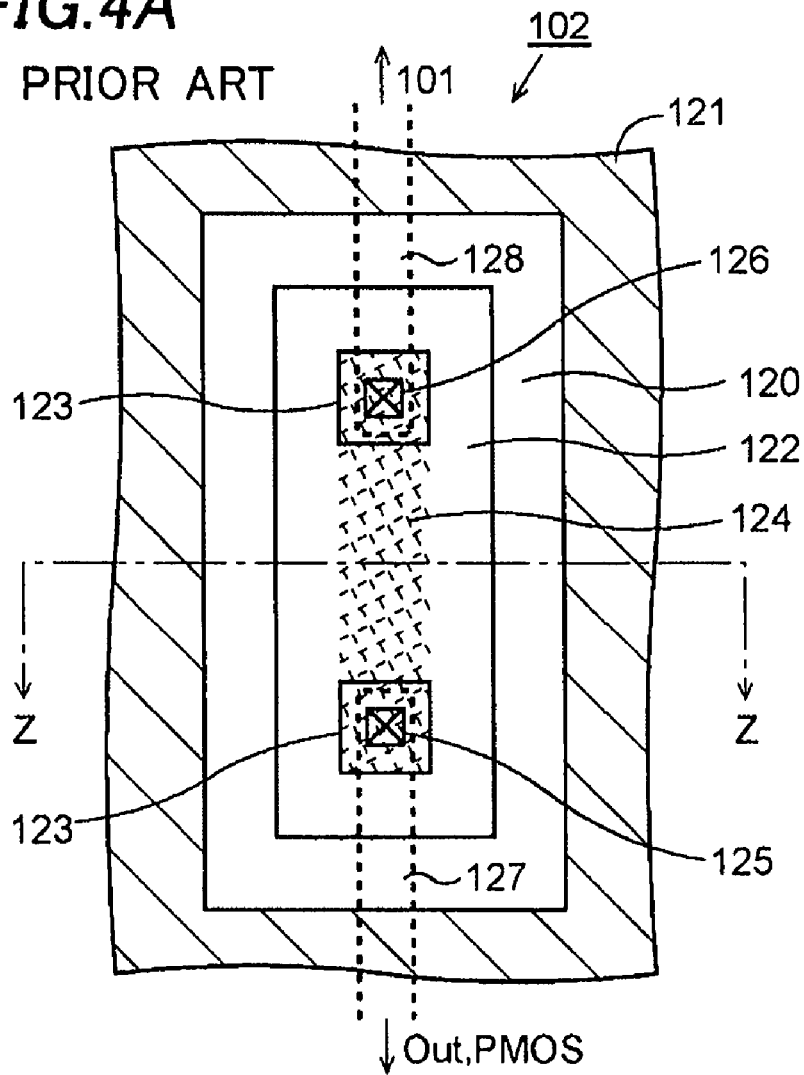
FIGS. 4A and 4B are a plan view and a cross-sectional view for explaining the conventional semiconductor device.
Figure 4B:
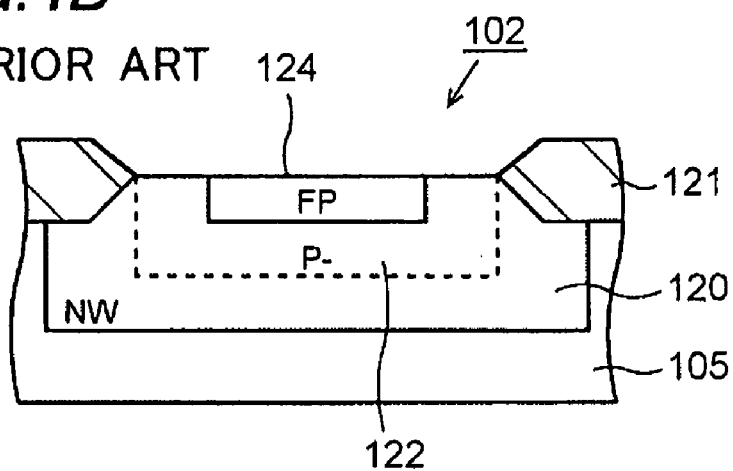

A semiconductor device of an embodiment of the invention will be described referring to FIGS. 1A, 1B and 2. Since a schematic circuit diagram of a drive circuit of a vacuum fluorescent display using the semiconductor device of the embodiment is the same as that of the conventional drive circuit (FIG. 2), the description thereof will be omitted or simplified and device structures will be mainly described in detail. FIG. 1A is a plan view of the semiconductor device of the embodiment, and FIG. 1B is a cross-sectional view of FIG. 1A along line X-X.

This semiconductor device mainly includes a region of a PMOS 1 and a region of a pull-down resistor 2. The PMOS 1 is so configured that a plurality of P-channel type MOS transistor structures forms one high voltage PMOS 1 as a whole. It is also possible that one P-channel type MOS transistor structure and a resistor form the semiconductor device. It is also possible to dispose a plurality of resistors that have the same structure as that of the pull-down resistor 2 therein.

The PMOS 1 will be described first. As shown in FIGS. 1A and 1B, an N-type well region 11 is formed in a front surface of a P-type semiconductor substrate 10.

Gate electrodes 12 are annularly formed on the front surface of the semiconductor substrate 10 (the well region 11) with a gate insulation film (not shown) interposed therebetween. P$^-$-type low concentration drain regions 13 are formed in the front surface of the semiconductor substrate 10 (the well region 11) in regions surrounded by the gate electrodes 12 respectively, and P$^+$-type high concentration drain regions 14 for contacts are formed in the front surface of the low concentration drain regions 13 respectively. P$^+$-type high concentration source regions 15 corresponding to the low concentration drain regions 13 are formed in the front surface of the semiconductor substrate 10 (the well region 11) on the outside of the annular gate electrodes 12 so as to surround each of the gate electrodes 12. As shown in FIG. 1B, the adjacent low concentration drain regions 13 are formed at a predetermined distance of a space L, thereby securing a high breakdown voltage.

Contact portions 16 are formed on the high concentration drain regions 14 and the high concentration source regions 15, and wiring layers 17 and 18 are formed in the contact portions 16. The wiring layer 17 is commonly connected with the high concentration source regions 15, and the wiring layer 18 is commonly connected with the high concentration drain regions 14.

The wiring layer 17 is connected with a power supply voltage VDD, and the wiring layer 18 is connected with an output terminal Out and one end of the pull-down resistor 2 that will be described below.

Next, the pull-down resistor 2 will be described. The pull-down resistor 2 is formed in the front surface of the well region 11 in a region except the region formed with the PMOS 1. A P$^-$-type (low concentration) resistor layer 20 is formed in the front surface of the well region 11 so as to have a high breakdown voltage, and P$^+$-type (high concentration) electrode leading layers 21 for forming contacts are formed in the front surface of the resistor layer 20 like islands. It is possible to form the resistor layer 20 in the ion implantation process for forming the low concentration drain regions 13 of the PMOS 1. In the embodiment, the resistor layer 20 and the low concentration drain region 13 adjacent thereto are formed at a predetermined distance M as shown in FIG. 1B, thereby securing a high breakdown voltage of the pull-down resistor 2. A P-type impurity ion is implanted between the electrode leading layers 21 opposing each other to form an impurity layer 22 (FP) in order to prevent voltage dependence.

Contact portions 23 and 24 are formed on the electrode leading layers 21, and wiring layers 25 and 26 are formed in these contact portions. The electrode leading layer 21 is connected with the wiring layer 18 of the PMOS 1 through the wiring layer 25, and a node thereof is connected with the output terminal Out. The other electrode leading layer 21 is connected with a negative voltage supply terminal 101 through the wiring layer 26.

A conductive layer 30 (e.g. a polysilicon layer) is formed on the front surface of the well region 11 so as to surround the resistor layer 20. This conductive layer 30 is connected with the power supply voltage VDD. The conductive layer 30 functions as a gate like for the MOS transistor structure, and isolates the pull-down resistor 2 from the PMOS 1 during normal operation in the embodiment. That is, since a predetermined high level voltage (the power supply voltage VDD in the embodiment) is applied to the conductive layer 30 during normal operation, a channel is not formed under the conductive layer 30 and an unnecessary current does not flow under the conductive layer 30. Although the conductive layer 30 is connected with the power supply voltage VDD through the wiring layer 17 in FIG. 1A, it may be connected with the power supply voltage VDD through the other wiring.

Since the conductive layer 30 is formed in the process of forming the gate electrodes 12 of the PMOS 1, the manufacturing process is not complex.

An interlayer insulation film 31 is formed on the front surface of the semiconductor substrate 10 including on the gate electrodes 12 and the conductive layer 30, and contact portions 16, 23 and 24 are formed reaching the high concentration drain regions 14, the high concentration source regions 15 and the electrode leading layers 21. An element isolation insulation film 32 is formed by a LOCOS method or the like so as to surround the PMOS 1 and the pull-down resistor 2 as a whole.

In this manner, in the semiconductor device of the embodiment, both the MOS transistor and the resistor are formed together in one region surrounded by the element isolation insulation film 32. Therefore, the area of the element is reduced. Furthermore, since the space M between the resistor layer 20 and the MOS transistor impurity region (the low concentration drain region 13 in this embodiment) adjacent thereto is equal to the space L between the low concentration impurity regions of the MOS transistor, and the design of the conductive layer 30 is the same as that of the gate electrode 12 of the MOS transistor, a minimum size element is formed while securing the breakdown voltages of the MOS transistor and the resistor.

Furthermore, the resistor is isolated from the other elements by using the conductive layer without using the element isolation insulation film formed by the LOCOS method or the like. This structure prevents contact between the resistor layer of the resistor and the element isolation insulation film, thereby preventing the degradation of the breakdown voltage and enhances reliability.

The invention is not limited to the above embodiment and includes such modifications as to be readily apparent to those skilled in the art. For example, although the above embodiment is described on the pull-down resistor, the invention may be applied to a pull-up resistor instead. The invention is widely applied to semiconductor devices having a resistor on a semiconductor substrate, and it is particularly preferable to apply the invention to a semiconductor device having both a MOS transistor and a resistor together.

The structures described above avoid contact between the element isolation insulation film and the resistor layer with the conductive layer surrounding the resistor layer. This prevents the degradation of the breakdown voltage due to stress concentration on the end of the element isolation insulation film and enhances the reliability of the resistor. Furthermore, the MOS transistor and the resistor are formed in one region surrounded by the element isolation insulation film, so that a long space of an element isolation insulation film conventionally formed between a MOS transistor and a resistor is not necessary, thereby miniaturizing the semiconductor device.

What is claimed is:

1. A semiconductor device comprising:
    a semiconductor substrate of a first general conductivity type;
    a well layer of a second general conductivity type formed in a surface portion of the substrate;
    a MOS transistor formed on the well layer;
    a resistor comprising a resistor layer of the first general conductivity type formed in a surface portion of the well layer and a conductive layer formed on the well layer so as to surround the resistor layer; and
    an element isolation insulation film formed on the surface portion of the substrate so as to surround, in plan view of the semiconductor device, the MOS transistor and the resistor,
    wherein in the plan view of the semiconductor device the MOS transistor and the resistor are disposed in the same well layer without being separated by an element isolation insulation film.

2. The semiconductor device of claim 1, wherein the MOS transistor comprises a gate electrode surrounding part of the surface portion of the substrate.

3. A drive circuit of a vacuum fluorescent display, comprising:
    a semiconductor substrate of a first general conductivity type;
    a well layer of a second general conductivity type formed in a surface portion of the substrate;
    a MOS transistor formed on the well layer and comprising a source and a drain;
    a resistor comprising a resistor layer of the first general conductivity type formed in a surface portion of the well layer and a conductive layer formed on the well layer so as to surround the resistor layer, the resistor further comprising a first terminal and a second terminal that is connected with the drain;
    an element isolation insulation film formed on the surface portion of the substrate so as to surround, in plan view of the semiconductor device, the MOS transistor and the resistor;
    a negative voltage supply terminal supplying a negative voltage to the first terminal; and an output terminal connected with a node between the drain and the second terminal,
    wherein the source and the conductive layer are configured to receive a power supply voltage, and
    in the plan view of the semiconductor device the MOS transistor and the resistor are disposed in the same well layer without being separated by an element isolation insulation film.

4. The drive circuit of claim 3, wherein the MOS transistor comprises a gate electrode surrounding part of the surface portion of the substrate.

* * * * *